United States Patent
Kim et al.

(10) Patent No.: US 10,692,734 B2
(45) Date of Patent: Jun. 23, 2020

(54) METHODS OF PATTERNING NICKEL SILICIDE LAYERS ON A SEMICONDUCTOR DEVICE

(71) Applicant: APPLIED MATERIALS, INC., Santa Clara, CA (US)

(72) Inventors: Jong Mun Kim, San Jose, CA (US); Chentsau Chris Ying, Cupertino, CA (US); He Ren, San Jose, CA (US); Srinivas D. Nemani, Sunnyvale, CA (US); Ellie Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/171,053

(22) Filed: Oct. 25, 2018

(65) Prior Publication Data
US 2020/0135492 A1 Apr. 30, 2020

(51) Int. Cl.
H01L 23/52 (2006.01)
H01L 21/3213 (2006.01)
H01L 23/532 (2006.01)

(52) U.S. Cl.
CPC .. *H01L 21/32137* (2013.01); *H01L 23/53209* (2013.01)

(58) Field of Classification Search
CPC ............... H01L 21/32137; H01L 23/53209
USPC ....................................................... 257/754
See application file for complete search history.

(56) References Cited

U.S. PATENT DOCUMENTS

| | | | |
|---|---|---|---|
| 5,310,456 A | 5/1994 | Kadomura | |
| 6,998,153 B2 | 2/2006 | Chiang et al. | |
| 8,395,203 B2 * | 3/2013 | Chakihara | G11C 16/0466 257/316 |
| 8,698,249 B2 * | 4/2014 | Mise | H01L 21/28194 257/369 |
| 9,613,859 B2 | 4/2017 | Lakshmanan et al. | |
| 2006/0017165 A1 | 1/2006 | Ni et al. | |
| 2011/0312171 A1 | 12/2011 | Lim et al. | |
| 2018/0366328 A1 | 12/2018 | Ren et al. | |

FOREIGN PATENT DOCUMENTS

JP 05-299366 A 11/1993
KR 10-2008-0071705 A 8/2008

OTHER PUBLICATIONS

U.S. Appl. No. 16/171,053, filed Oct. 25, 2018, Examiner Luan C Thai.
International Search Repot for PCT/US2019/057440 dated Feb. 12. 2020.

* cited by examiner

*Primary Examiner* — Luan C Thai
(74) *Attorney, Agent, or Firm* — Moser Taboada; Alan Taboada

(57) ABSTRACT

Methods and apparatus for processing a substrate and etching a nickel silicide layer are provided herein. In some embodiments, a method of etching a nickel silicide film in a semiconductor device include: contacting a nickel silicide film disposed on a substrate in a process chamber with an etching gas sufficient to form one or more soluble or volatile products in order to reduce or eliminate re-deposition of products formed from the nickel silicide film upon the nickel silicide film.

20 Claims, 5 Drawing Sheets

400

FLOWING AN ETCHING GAS COMPRISING A MIXTURE OF GASES INTO A PROCESS CHAMBER HAVING A SUBSTRATE DISPOSED THEREIN, THE SUBSTRATE COMPRISING A NICKEL SILICIDE LAYER HAVING A PATTERNED FILM STACK DISPOSED THEREON, THE PATTERNED FILM STACK COVERING A FIRST PORTION OF THE NICKEL SILICIDE LAYER AND EXPOSING A SECOND PORTION OF THE NICKEL SILICIDE LAYER ~402

CONTACTING THE NICKEL SILICIDE LAYER WITH THE ETCHING GAS TO REMOVE THE SECOND PORTION WHILE FORMING ONE OR MORE NICKEL SILICIDE EDGES TO THE PATTERNED FILM STACK, WHEREIN THE ONE OR MORE NICKEL SILICIDE EDGES HAVE A PROFILE OF GREATER THAN 80 DEGREES ~404

FIG. 4

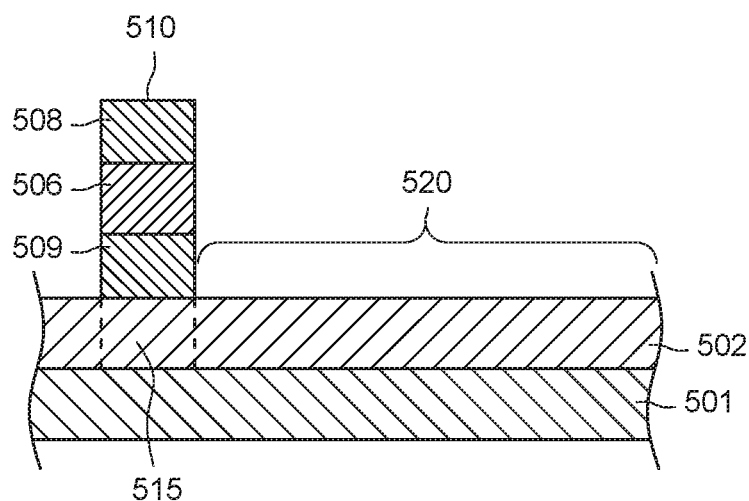

FIG. 5A

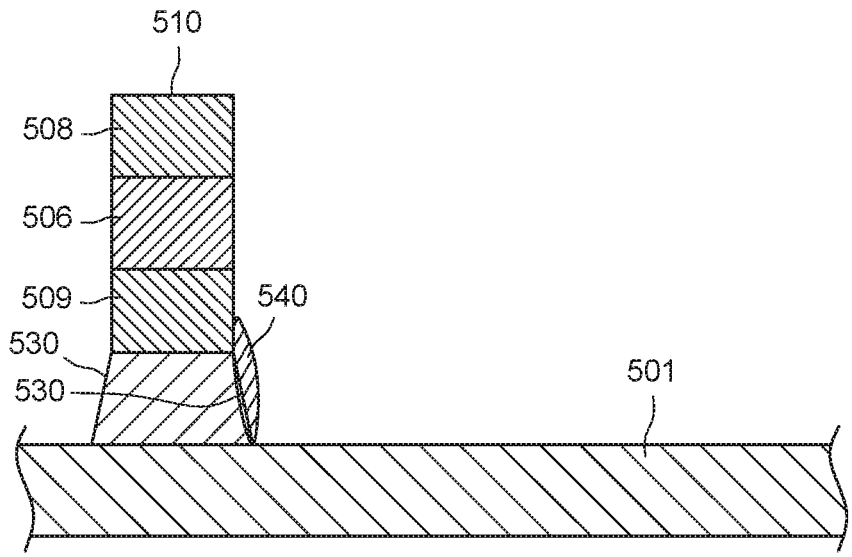

CONTACTING A NICKEL SILICIDE FILM DISPOSED ON A SUBSTRATE IN A PROCESS CHAMBER WITH AN ETCHING GAS SUFFICIENT TO FORM A FIRST NICKEL SILICIDE PORTION HAVING AN EDGE PROFILE GREATER THAN 80 DEGREES AND A SECOND NICKEL SILICIDE PORTION, WHEREIN THE ETCHING GAS COMPRISES A MIXTURE OF GASES PRESELECTED TO REACT WITH THE SECOND NICKEL SILICIDE PORTION TO EXTRACT SILICON AND NICKEL FROM THE SECOND NICKEL SILICIDE PORTION, REACT WITH NICKEL TO FORM A VOLATILE NICKEL CARBONYL, REACT WITH SILICON TO FORM ONE OR MORE VOLATILE BY-PRODUCTS, AND TO FORM A PASSIVATION LAYER UPON THE FIRST NICKEL SILICIDE PORTION ~ 602

FIG. 6

METHODS OF PATTERNING NICKEL SILICIDE LAYERS ON A SEMICONDUCTOR DEVICE

FIELD

Embodiments of the present disclosure generally relate to the processing of semiconductor substrates. More particularly, embodiments of the disclosure relate to plasma etching nickel silicide layers on semiconductor substrates using chemistry assisted etching techniques.

BACKGROUND

Nickel silicide is a desired target as a conductive layer within a semiconductor device. However, working with nickel silicide is difficult as etching nickel silicide may produce non-volatile reactive by-products, depending upon the reaction conditions. The presence of non-volatile reactive by-products may result in problematic metal re-deposition and/or be detrimental to the profile, function, or patterning of a feature disposed within a semiconductor device.

One process useful in the continuous scaling down of features is an atomic layer etch during plasma processing of a substrate. Conventionally, the atomic layer etch is performed using a processing scheme which relies on switching gas mixtures to achieve the appropriate plasma chemical composition for passivation (functionalization, adsorption, deposition) and the appropriate plasma chemical composition for a subsequent etch process.

Typically, a substrate is first exposed to a minimally etching plasma to passivate an upper layer. During the passivation process, the ion energies of the plasma may be less than the threshold for etching the passivated top layer. Next, the passivated layer is exposed to an etching plasma to remove the passivated top layer. However, the inventors have observed such a scheme suffers, especially where the layer to be etched is nickel silicide, from the formation of problematic plasma generated particulate by-products including non-volatile by-products and/or insoluble by-products including metal and metallic compounds. In the case of plasma etching a nickel silicide layer, the metal and metallic compounds problematically redeposit on a workpiece leading to e.g., electrical shorts and other defects such as patterning defects. Some defects include re-deposition of metals and metallic compounds disposed for example on the sidewall of a feature disposed upon a workpiece which may be detrimental to a feature sidewall profile, resulting in non-straight feature profiles which are problematic for downstream processing.

Accordingly, the inventor has developed improved methods of processing a substrate and etching a nickel silicide layer.

SUMMARY

Methods and apparatus for processing a substrate and etching a nickel silicide layer are provided herein. In some embodiments, a method of etching a nickel silicide film in a semiconductor device, includes: contacting a nickel silicide film disposed on a substrate in a process chamber with an etching gas sufficient to form one or more soluble or volatile products in order to reduce or eliminate re-deposition of products formed from the nickel silicide film upon the nickel silicide film.

In some embodiments, a method of processing a substrate within a processing volume of a substrate processing chamber, includes: (a) providing a process gas comprising an etching gas within the processing volume; and (b) applying a first power to form a plasma from the process gas, wherein the plasma has a first ion energy to etch a nickel silicide layer atop a substrate layer, wherein the etching gas includes constituents preselected to form one or more soluble or volatile products.

In some embodiments, a method of etching a nickel silicide film in a semiconductor device, includes: flowing an etching gas including a mixture of gases into a process chamber having a substrate disposed therein, the substrate including a nickel silicide layer having a patterned film stack disposed thereon, the patterned film stack covering a first portion of the nickel silicide layer and exposing a second portion of the nickel silicide layer; contacting the nickel silicide layer with the etching gas to remove the second portion while forming one or more nickel silicide edges to the film stack, wherein the one or more nickel silicide edges have a profile of greater than 80 degrees.

In some embodiments, a method of etching a nickel silicide film in a semiconductor device, includes: contacting a nickel silicide film disposed on a substrate in a process chamber with an etching gas sufficient to form a first nickel silicide portion having an edge profile greater than 80 degrees and a second nickel silicide portion, wherein the etching gas comprises a mixture of gases preselected to react with the second nickel silicide portion to extract silicon and nickel from the second nickel silicide portion, react with nickel to form a volatile nickel carbonyl, react with silicon to form one or more volatile by-products, and to form a passivation layer upon the first nickel silicide portion.

In some embodiments, a semiconductor film stack, includes: a nickel silicide layer disposed within a plurality of layers, wherein the nickel silicide layer has a side profile of greater than 80 degrees, and wherein the nickel silicide layer is suitable as a metal line within a film stack.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 4 depicts a flow chart of a method for processing a substrate in accordance with some embodiments of the present disclosure.

FIGS. 5A-D depict the stages of processing a substrate in accordance with some embodiments of the present disclosure.

FIG. 6 depicts a flow chart of a method for processing a substrate in accordance with some embodiments of the present disclosure.

Figure 1:
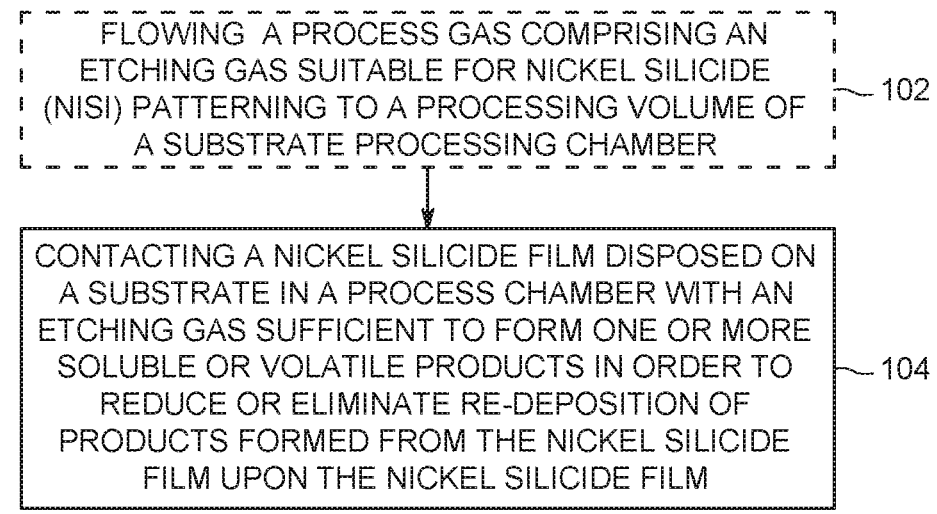
FIG. 1 depicts a flow chart of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. The inventive methods advantageously facilitate etching a nickel silicide material to facilitate the use of nickel silicide as a conductor material for interconnect applications. Embodiments of the inventive methods can advantageously provide passivation and etching while utilizing a predetermined plasma chemical composition from a single gas mixture. As a result, the methods described in the disclosure allow for etching without the need to introduce multiple gas mixtures and for nickel silicide vertical profiles in a film stack to be 80 degrees or above by reducing or eliminating metallic by-products and sidewall re-deposition thereof which problematically produce a tapered profile (such as about a 50 to 60 degree vertical profile) and low mask selectivity. Further, the preselected constituents of the etching gas promote the formation of plasma generated particulate by-products including volatile by-products and/or soluble by-products easily removed from the process chamber without redepositing on any remaining patterned nickel silicide material. The methods provided in the present disclosure allow for control of product formation where ion energy from plasma is used to etch a nickel silicide layer. The methods provided in the present disclosure provide chemistry assisted reactive ion etch to allow for nickel silicide positioned within a film stack to be patterned with one or more substantially straight side edges, such as one or more edges having a side profile greater than 80 degrees from the substrate plane to facilitate additional down-stream processing and eliminating defect generation therein.

FIG. 1 depicts a flow chart of a method 100 for processing a substrate in accordance with some embodiments of the present disclosure. The method 100 is described herein with respect to the structure depicted in FIGS. 2A-2B. The method 100 of the present disclosure may be performed in a single process chamber capable of performing both etching and deposition. Such a suitable process chamber may be a standalone process chamber, or part of a cluster tool. Alternatively, the methods disclosed herein may be performed in separate chambers that also may be standalone or part of a cluster tool.

Figure 3:
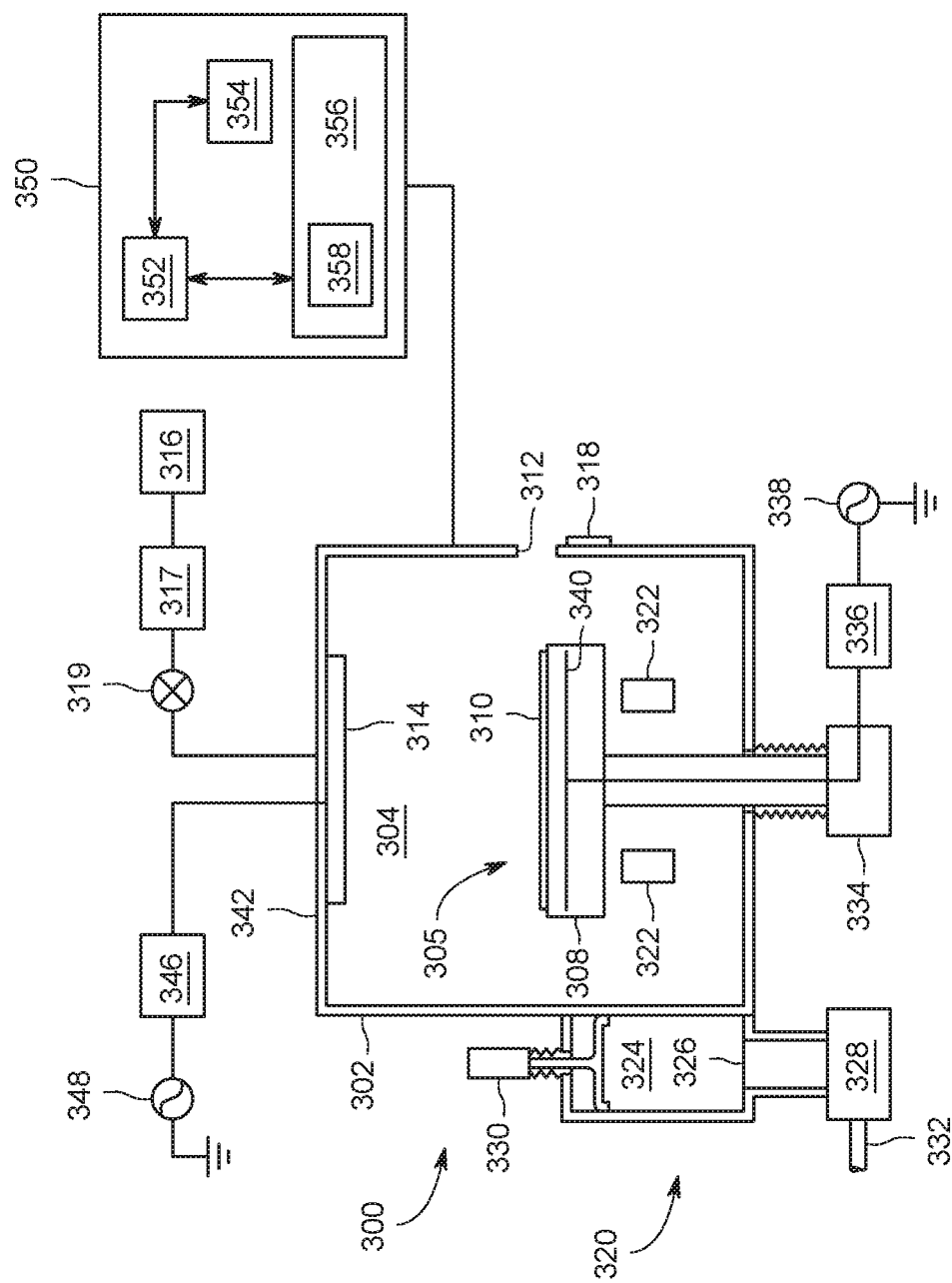
FIG. 3 depicts schematic view of a substrate processing system in accordance with some embodiments of the present disclosure.

FIG. 3 described below depicts an apparatus 300 suitable for processing a substrate in accordance with some embodiments of the present disclosure. The apparatus 300 may comprise a controller 350 and a process chamber 302 having an exhaust system 320 for removing excess process gases, processing by-products, or the like, from the interior of the process chamber 302. Exemplary process chambers may include the DPS®, ENABLER®, ADVANTEDGE™, AVATAR™, or other process chambers, available from Applied Materials, Inc. of Santa Clara, Calif. Other suitable process chambers may similarly be used.

The process chamber 302 has an inner volume 305 that may include a processing volume 304. The processing volume 304 may be defined, for example, between a substrate support pedestal 308 disposed within the process chamber 302 for supporting a substrate 310 during processing and one or more gas inlets, such as a showerhead 314 and/or nozzles provided at predetermined locations. In some embodiments, the substrate support pedestal 308 may include a mechanism that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include mechanisms for controlling the substrate temperature (such as heating and/or cooling devices, not shown) and/or for controlling the species flux and/or ion energy proximate the substrate surface. In embodiments, the substrate temperature may be maintained at a temperature between about 30 to 250 degrees Celsius. In embodiments, process chamber 302 is suitable for providing a source power (Ws) of about 100 watts to about 3000 watts, and a bias power (Wb) of about 30 watts to about 500 watts. In embodiments, process chamber 302 is suitable for providing a source power (Ws) of about 1500 watts, and a bias power (Wb) of about 100 watts. In some embodiments, the processing volume 304 is maintained at a pressure of 3 mTorr to about 100 mTorr. In embodiments, process chamber conditions described herein are suitable for reacting a process gas of the present disclosure with nickel silicide as described herein.

In some embodiments, the substrate support pedestal 308 may include an RF bias electrode 340. In embodiments, the RF bias electrode 340 may be coupled to one or more RF bias power sources (RF power source 338 shown in FIG. 3) through one or more respective waveform adjusters (a first bias waveform adjuster 336 shown) capable of adjusting various voltage waveforms supplied to an electric apparatus.

In some embodiments, the apparatus 300 may utilize capacitively coupled RF power for plasma processing, although the apparatus may also or alternatively use inductive coupling of RF power for plasma processing. For example, the process chamber 302 may have a ceiling 342 made from dielectric materials and a showerhead 314 that is at least partially conductive to provide an RF electrode or a separate RF electrode may be provided. The showerhead 314 (or other RF electrode) may be coupled to one or more RF power sources (RF power source 348 shown) through one or more respective waveform adjusters (a first source waveform adjuster 346 shown).

Referring back to FIG. 1, the method 100 begins at 102 by flowing a process gas including an etching gas suitable for nickel silicide (NiSi) patterning to a processing volume (e.g. inner volume 305 depicted in FIG. 3) of a substrate processing chamber (e.g. process chamber 302 depicted in FIG. 3). The process gas may be introduced into the processing volume by a showerhead 314. In some embodiments, the processing volume is between a first electrode (e.g. the RF bias electrode 340 in FIG. 3) and a second electrode (e.g. the showerhead 314 or a separate RF electrode as described above). The composition of the processing gas can vary depending on the nickel silicide (NiSi) being etched and the etching gas that is used. In embodiments a metal silicide such as $NiSi_x$ wherein x is an integer (such as 1, 2 or more) is suitable for use herein. In embodiments, $NiSi_x$ may be deposited upon a substrate by known methods of depositing thin films such as chemical vapor deposition, physical vapor deposition, or atomic layer deposition to a predetermined thickness.

In some embodiments, the etching gas comprises a fluorocarbon gas. In some embodiments, the fluorocarbon gas may be carbon tetrafluoride ($CF_4$), methyl trifluoride ($CHF_3$), octafluorocyclobutane ($C_4F_8$), hexafluorobutadiene ($C_4F_6$), nitrogen trifluoride ($NF_3$), sulfur hexafluoride ($SF_6$), or the like. In embodiments, a fluorocarbon gas is supplied to the process chamber in an amount sufficient to etch a nickel silicide layer to a predetermined thickness. The thickness of the nickel silicide layer may be varied depending upon the concentration of the fluorocarbon gas and duration the gas is disposed within process chamber 302.

In some embodiments, the etching gas comprises a noble gas, such as argon, helium, or the like. In some embodiments, the process gas may further comprise an oxygen containing gas, such as oxygen ($O_2$), or carbon monoxide (CO) to achieve a predetermined profile and selectivity to an underlying layer. In some embodiments, the process gas may further comprise nitrogen gas ($N_2$) or hydrogen gas ($H_2$). In some embodiments, the etching gas comprises a halogen gas such as chlorine ($Cl_2$), boron trichloride ($BCl_3$), or hydrogen bromide (HBr).

In embodiments, the etching gas comprises carbon monoxide (CO) in an amount sufficient to react with nickel of a nickel silicide layer to be etched, to form nickel tetracarbonyl ($Ni(CO)_4$) or a volatile nickel carbonyl.

In embodiments, the etching gas comprises carbon tetrafluoride ($CF_4$) to provide fluorine in an amount sufficient to extract silicon from the nickel silicide layer to be etched, to form silicon tetrafluoride ($SiF_4$), wherein silicon tetrafluoride ($SiF_4$) is characterized as a volatile reactive by-product.

In embodiments, the etching gas comprises boron trichloride ($BCl_3$) to provide chlorine ($Cl^-$, or $Cl_2$) in an amount sufficient to extract silicon from the nickel silicide layer (NiSi) to be etched, to form silicon tetrachloride ($SiCl_4$), wherein silicon tetrachloride is characterized as a volatile reactive by-product. In embodiments, boron trichloride provides $BCl_3+$ as a major bombardment ion. In embodiments, $BCl_3$ is provided under conditions suitable for forming $BCl_x$ (wherein x is an integer such as 1, 2 or more) passivate, as a water soluble composition.

In one embodiment, the etching gas includes constituents sufficient to react with and etch a layer of nickel silicide (NiSi) in a semiconductor device as shown in the reaction below:

$$NiSi+CF_4+BCl_3+CO \rightarrow BCl_x+SiCl_4+SiF_4+Ni(CO)_4$$

In embodiments, $BCl_x$ (wherein x is an integer such as 1, 2, or more) is a water-soluble passivate. In embodiments, $SiCl_4$ and $SiF_4$ are volatile compositions, and/or reactive by-products. In embodiments, $Ni(CO)_4$ is a volatile nickel carbonyl. In some embodiment, other soluble passivates formed from chemistry of the present disclosure include $NiCl_x$, $NiF_x$, $CCl_x$, and combinations thereof including $BCl_x$ (wherein x is an integer).

In another embodiment, the etching gas includes reactants in amounts sufficient to react with and etch a layer of nickel silicide (NiSi) in a semiconductor device as shown in the reaction below:

$$NiSi+Cl_2+BCl_3+CO \rightarrow BCl_x+SiCl_4+Ni(CO)_4$$

In embodiments, $BCl_x$ (wherein x is an integer) is a water-soluble passivate. In embodiments, $SiCl_4$ is a volatile composition, and/or a reactive by-product. In embodiments, $Ni(CO)_4$ is a volatile nickel carbonyl.

In embodiments, a sputter/etch rate of about 3 angstroms/sec including $BCl_3^+$ is preselected to facilitate reactions in accordance with the present disclosure. In embodiments, a source power may be provided an amount of about 1500 Ws. In embodiments, a low bias power (Wb) such as about 100 Wb is provided for sputtering of $BCl_3^+$, under conditions sufficient to form chemical reactions with NiSi where:

$$Ni+4CO \rightarrow Ni(CO)_4;$$

$$Si+4F \rightarrow SiF_4;$$

$$Si+4Cl \rightarrow SiCl_4.$$

In embodiments, soluble products may be removed by contacting the workpiece with DI water in amounts sufficient to remove the soluble products. In embodiments, volatile products may be exhausted or pumped away from the workpiece.

Figure 2A:
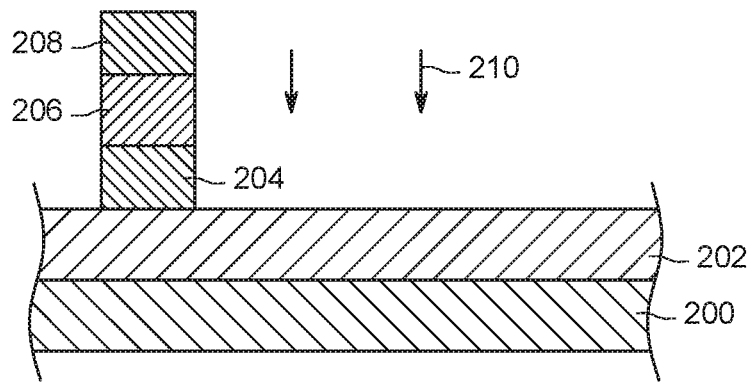
FIGS. 2A-B depict the stages of processing a substrate in accordance with some embodiments of the present disclosure.
Figure 2B:
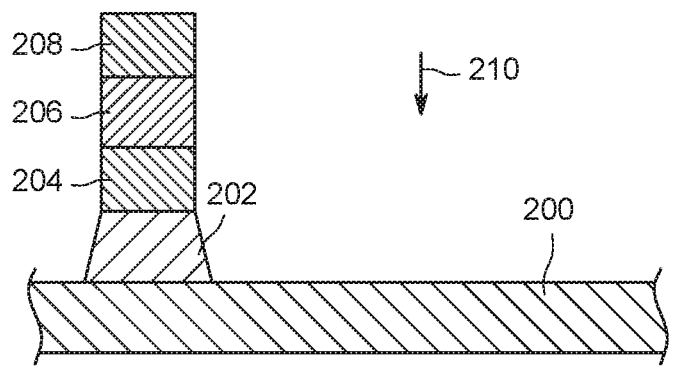

Method 100, at 104 includes contacting a nickel silicide film disposed on a substrate in a process chamber with an etching gas sufficient to form one or more soluble or volatile products in order to reduce or eliminate re-deposition of products formed from the nickel silicide film upon the nickel silicide film. In embodiments, the etching gas is supplied under conditions where a first voltage waveform is applied from a first RF power source (e.g., RF power source 348) to the second electrode to form a plasma from the process gas. The plasma is formed within the processing volume of the process chamber. As depicted in FIGS. 2A and 2B, the plasma 210 has a first ion energy sufficient to etch a nickel silicide layer 202 directly atop substrate 200. In some embodiments the substrate 200 may be any suitable substrate used in a semiconductor manufacturing process. For example, the substrate 200 may comprise one or more of a dielectric material, silicon (Si), metals, or the like. In addition, the substrate 200 may include additional layers of materials or may have one or more completed or partially completed structures formed in, or on, the substrate 200. In embodiments, the substrate 200 comprises a dielectric layer such as silicon oxide, a low-k material (e.g., a material having a dielectric constant less than silicon oxide, or less than about 3.9), or the like. In embodiments, the nickel silicide layer 202 is positioned between substrate 200 and a third layer 204 such as a titanium nitrate (TiN) or tantalum nitrate (TaN) layer. In embodiments, nickel silicide layer 202 may comprise nickel silicide in an amount sufficient to form a layer having a thickness of 5 to 20 or 10 to 13 nanometers. In embodiments, third layer 204 may be titanium nitrate (TiN) or tantalum nitrate (TaN) layer in an amount sufficient to form a 20 to 30 nanometer thick layer such as a layer having a thickness of 25 nanometers. Third layer 204 is positioned between a nickel silicide layer 202 and fourth layer 206 such as an oxide layer. In embodiments, the fourth layer 206 is an oxide layer having a thickness of about 20 to 30 or about 25 nanometers. A fifth layer 208 is also shown atop the fourth layer, such as an SOC layer. In embodiments, the fifth layer 208 of a patterned fil stack may have a thickness in the amount of about 75 to 125 nanometers, or about 100 nanometers. Upon application of plasma 210 in accordance with the present disclosure, nickel silicide layer 202 is etched and patterned such that NiSi is removed in an area adjacent the film stack as shown in FIG. 2B. A patterned film stack is formed including layers such as nickel silicide layer 202, third layer 204, fourth layer 206 and fifth layer 208.

In some embodiments, a first ion energy of the plasma is about 0.1 eV to about 100 eV. In some embodiments, a second RF power source (e.g., RF power source 406) is applied to the first electrode to form the plasma. In some embodiments, the second RF power source provides about 30 watts about 500 watts of power to the first electrode.

In some embodiments, of the present disclosure a method of processing a substrate within a processing volume of a substrate processing chamber, includes: (a) providing a process gas comprising an etching gas within the processing volume; and (b) applying a first power source to form a plasma from the process gas, wherein the plasma has a first ion energy to etch a nickel silicide layer atop a substrate layer, wherein the etching gas include constituents preselected to form one or more soluble or volatile products. In some embodiments, the process gas comprises $BCl_3$/carbon monoxide (CO)/argon (Ar) applied to the process volume for about 180 seconds. In embodiments, the process gas is purged to remove any by-products formed from the reaction. In embodiments, the substrate is rinsed with water to remove any soluble by-products formed in the reaction.

In one embodiment, a process gas comprising $BCl_3$/carbon monoxide (CO)/argon (Ar) and $CF_4$ is applied to the process volume including a workpiece of the present disclosure for about 180 seconds under conditions characterized as 1500 Ws, 100 Wb, and a pressure of about 5 mTorr.

FIG. 4 depicts a flow chart of a method 400 for processing a substrate in accordance with some embodiments of the present disclosure. The method 400 is described herein with respect to the structure depicted in FIGS. 5A-5D. The method 400 of the present disclosure may be performed in a single process chamber capable of performing both etching and deposition. Such a suitable process chamber may be a standalone process chamber, or part of a cluster tool. Alternatively, the methods disclosed herein may be performed in separate chambers that also may be standalone or part of a cluster tool. The method 400 may be performed in apparatus 300 described above in FIG. 3 suitable for processing a substrate under condition described above.

The method 400 of etching a nickel silicide film generally begins at 402 by flowing an etching gas including a mixture of gases into a process chamber (e.g. process chamber 302 depicted in FIG. 3) having a substrate 501 disposed therein, the substrate 501 including a nickel silicide layer 502 having a patterned film stack 510 disposed thereon, the patterned film stack 510 covering a first portion 515 (shown in phantom in FIG. 5A) of the nickel silicide layer 502 and exposing a second portion 520 of the nickel silicide layer 502. At 404, method 400 continues with contacting the nickel silicide layer 502 with the etching gas to remove the second portion 520 while forming one or more nickel silicide edges 530 (See FIG. 5B) to the patterned film stack 510, wherein the one or more nickel silicide edges 530 have a profile of greater than 80 degrees. In embodiments, the angle of the one or more nickel silicide edges 530 is measured in relation to the substrate plane 503.

Figure 5B:
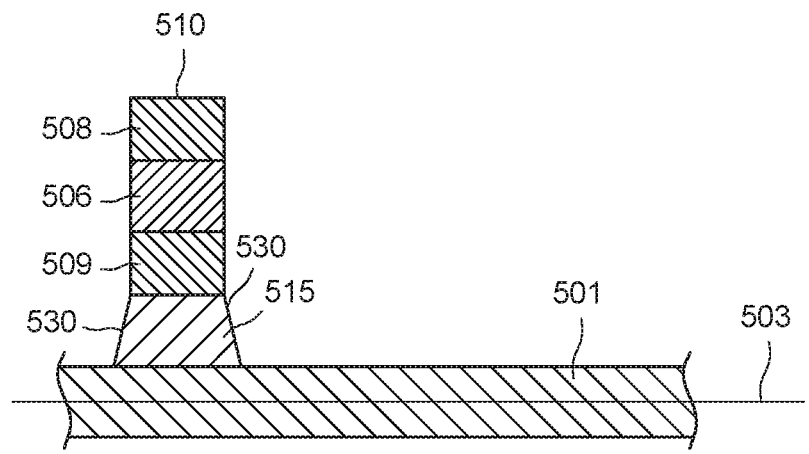
Figure 5C:
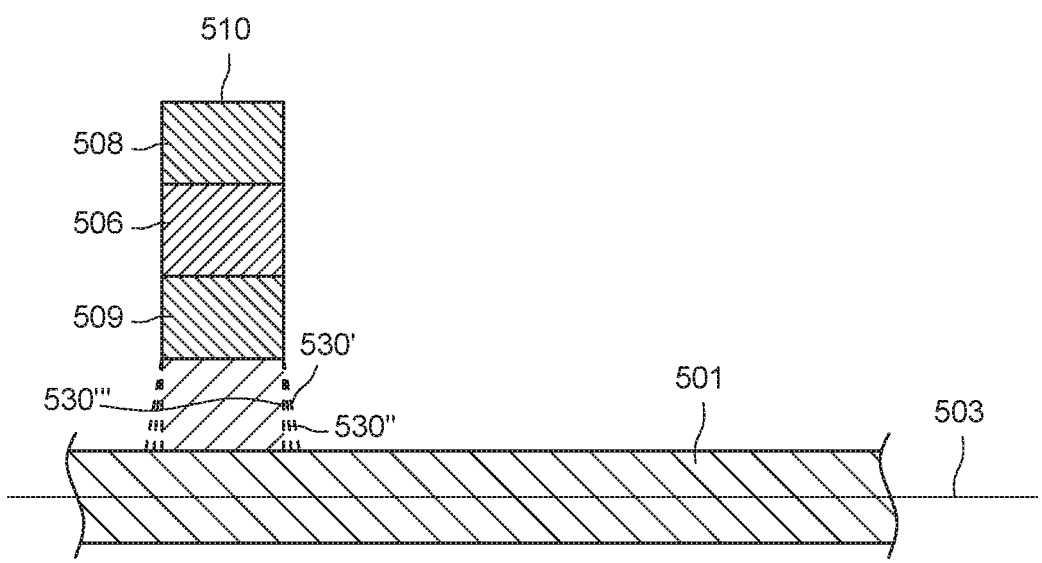

Referring to FIGS. 5B and 5C, in embodiments the one or more nickel silicide edges 530 may be a substantially vertical edge (such as 530''') such that the side profile of the one or more nickel silicide edges 530 are parallel to one or more edges of adjacent layers such as layer 506 and layer 509 of the patterned film stack 510, and perpendicular to a substrate plane 503 of substrate 501. In embodiments, the one or more nickel silicide edges 530 may be an angled edge such that the side profile of the one or more nickel silicide edges 530 joins or contacts at an angle to one or more edges of adjacent layers such as layer 506 and layer 509 of the patterned film stack 510, and on an angle to a substrate plane 503 of substrate 501. Referring to FIG. 5C, the one or more nickel silicide edges 530 may be an angled edge such that the side profile of the one or more nickel silicide edges 530 joins or contacts the substrate at an angle (θ) in the amount of 80 degrees to 90 degrees to the substrate plane 503 of substrate 501. In embodiments, the one or more nickel silicide edges 530 may include an angled edge including a side profile joining or contacting the substrate 501 on an angle (θ) in the amount of 85 degrees to 90 degrees to the substrate plane 503 of substrate 501. In some embodiments, the one or more nickel silicide edges 530 have a profile of about 90 degrees. In embodiments, nickel silicide edge 530''' (shown in phantom) is on an angle of about 90 degrees from the substrate plane 503. In embodiments, nickel silicide edge 530' (shown in phantom) is on an angle of about 85 degrees from the substrate plane 503. In embodiments, nickel silicide edge 530'' (shown in phantom) is on an angle of about 80 degrees from the substrate plane 503.

In some embodiments, contacting the nickel silicide layer with the etching gas forms a soluble passivation layer 540 (FIG. 5D) upon the patterned film stack 510 and/or on the one or more nickel silicide edges 530. In some embodiments, as the etch progresses and continues to etch the second portion 520 of the nickel silicide layer, the etching gas includes chemical species suitable for forming a soluble passivation layer 540. Upon completion of the etch, the workpiece may be rinsed, for example contacted with water, such as deionized water, to remove the soluble passivation layer 540 to expose the nickel silicide edge 530 having a desired angle with respect to the substrate plane (e.g., 80 to 90 degrees). In some embodiments, method 400 further comprises rinsing the film stack to remove soluble passivation layer 540 while exposing the one or more nickel silicide edges 530.

In embodiments, the etching gas includes a mixture of gases. For example the mixture of gases is preselected to form only soluble and volatile products upon reacting with the second portion 520. In embodiments, the mixture of gases comprises boron trichloride for forming a soluble passivation layer upon the one or more nickel silicide edges such as nickel silicide edge 530. In some embodiments, the mixture of gases are preselected to react with the second portion to extract silicon and nickel from the second portion 520, react with nickel to form a volatile nickel carbonyl, react with silicon to form one or more volatile by-products, and to form a passivation layer upon one or more nickel silicide edges. In embodiments, the mixture of gases comprises carbon monoxide in an amount sufficient to react with nickel to form a nickel carbonyl. In embodiments, the mixture of gases comprises carbon tetrafluoride in an amount sufficient to extract silicon from the second portion to form volatile silicon tetrafluoride. In embodiments, the mixture of gases comprises boron trichloride in an amount sufficient to extract silicon from the second portion to form volatile silicon tetrachloride. In embodiments, boron trichloride is provided as a bombardment ion and form a soluble $BCl_x$ passivation layer upon the one or more nickel silicide edges, wherein x is an integer. In embodiments, the mixture of gases comprises boron trichloride, carbon monoxide, carbon tetrafluoride in amounts and under conditions suitable for reacting with the second portion to form soluble $BCl_x$, volatile silicon tetrachloride, volatile silicon tetrafluoride, and volatile nickel carbonyl, wherein x is an integer.

Referring now to FIG. 6, a method 600 of etching a nickel silicide film in a semiconductor device generally begins at 602 by contacting a nickel silicide film disposed on a substrate in a process chamber with an etching gas sufficient to form a first nickel silicide portion having an edge profile greater than 80 degrees and a second nickel silicide portion, wherein the etching gas comprises a mixture of gases preselected to react with the second nickel silicide portion to extract silicon and nickel from the second nickel silicide portion, react with nickel to form a volatile nickel carbonyl, react with silicon to form one or more volatile by-products, and to form a passivation layer upon the first nickel silicide portion. In some embodiments, the etching gas comprises a fluorocarbon gas. In embodiments, the etching gas comprises argon, helium, oxygen containing gas, nitrogen gas ($N_2$), hydrogen gas ($H_2$), a halogen gas, chlorine ($Cl_2$), boron trichloride ($BCl_3$), hydrogen bromide (HBr), or combinations thereof. In embodiments, the etching gas comprises carbon monoxide (CO) in an amount sufficient to react with nickel of a nickel silicide layer to form nickel tetracarbonyl ($Ni(CO)_4$) or a volatile nickel carbonyl. In embodiments, a pressure of the process chamber is between about 3 mTorr and 100 mTorr. In one embodiments, the process chamber comprises $BCl_3$ provided at a flow rate of 0.5 to 100 sccm.

Returning to FIG. 3, the substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support pedestal 308 may be coupled to a lift mechanism 334 that may control the position of the substrate support pedestal 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support pedestal 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at predetermined flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support pedestal, or the like.

The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). 302. The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be any form of general-purpose computer processor that can be used in an industrial setting for controlling various chambers and subprocessors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support pedestal 308. The software routine 358, when executed by the CPU 352, transforms the general purpose computer into a specific purpose computer (controller) 350 that controls the chamber operation such that the methods disclosed herein are performed.

In embodiments the methods of the present disclosure are suitable for forming a semiconductor film stack, including: a nickel silicide layer disposed within a plurality of layers, wherein the nickel silicide layer has a side profile of greater than 80 degrees, and wherein the nickel silicide layer is suitable as a metal line within a film stack.

While the foregoing is directed to embodiments of the present disclosure, other and further embodiments of the disclosure may be devised without departing from the basic scope thereof.

The invention claimed is:

1. A method of etching a nickel silicide film, comprising:
    flowing an etching gas comprising a mixture of gases into a process chamber having a substrate disposed therein, the substrate comprising a nickel silicide layer having a patterned film stack disposed thereon, the patterned film stack covering a first portion of the nickel silicide layer and exposing a second portion of the nickel silicide layer; and
    contacting the nickel silicide layer with the etching gas to remove the second portion while forming one or more nickel silicide edges to the patterned film stack, wherein the one or more nickel silicide edges have a profile of greater than 80 degrees.

2. The method of claim 1, wherein contacting the nickel silicide layer with the etching gas forms a soluble passivation layer upon the patterned film stack and the one or more nickel silicide edges.

3. The method of claim 1, wherein the one or more nickel silicide edges have a profile of greater than 90 degrees.

4. The method of claim 1, wherein the mixture of gases is preselected to form only soluble and volatile products upon reacting with the second portion.

5. The method of claim 1, wherein the mixture of gases comprises boron trichloride for forming a soluble passivation layer upon the one or more nickel silicide edges.

6. The method of claim 1, further comprising rinsing the film stack to remove soluble passivation layer and expose the one or more nickel silicide edges.

7. The method of claim 1, wherein the mixture of gases are preselected to react with the second portion to extract silicon and nickel from the second portion, react with nickel to form a volatile nickel carbonyl, react with silicon to form one or more volatile by-products, and to form a passivation layer upon one or more nickel silicide edges.

8. The method of claim 1, wherein the mixture of gases comprises carbon monoxide in an amount sufficient to react with nickel to form a nickel carbonyl.

9. The method of claim 1, wherein the mixture of gases comprises carbon tetrafluoride in an amount sufficient to extract silicon from the second portion to form volatile silicon tetrafluoride.

10. The method of claim 1, wherein the mixture of gases comprises boron trichloride in an amount sufficient to extract silicon from the second portion to form volatile silicon tetrachloride.

11. The method of claim 1, wherein boron trichloride is provided as a bombardment ion and form a soluble BClx passivation layer upon the one or more nickel silicide edges.

12. The method of claim 1, wherein the mixture of gases comprises boron trichloride, carbon monoxide, carbon tetrafluoride in amounts and under conditions suitable for reacting with the second portion to form soluble BClx, volatile silicon tetrachloride, volatile silicon tetrafluoride, and volatile nickel carbonyl, wherein x is an integer.

13. A method of etching a nickel silicide film in a semiconductor device, comprising:
    contacting a nickel silicide film disposed on a substrate in a process chamber with an etching gas sufficient to form a first nickel silicide portion having an edge profile greater than 80 degrees and a second nickel silicide portion, wherein the etching gas comprises a mixture of gases preselected to react with the second nickel silicide portion to extract silicon and nickel from the second nickel silicide portion, react with nickel to form a volatile nickel carbonyl, react with silicon to form one or more volatile by-products, and to form a passivation layer upon the first nickel silicide portion.

14. The method of claim 13, wherein the etching gas comprises a fluorocarbon gas.

15. The method of claim 13, wherein the etching gas comprises argon, helium, oxygen containing gas, nitrogen gas ($N_2$), hydrogen gas ($H_2$), a halogen gas, chlorine ($Cl_2$), boron trichloride ($BCl_3$), hydrogen bromide (HBr), or combinations thereof.

16. The method of claim 13, wherein the etching gas comprises carbon monoxide (CO) in an amount sufficient to react with nickel of a nickel silicide layer to form nickel tetracarbonyl ($Ni(CO)_4$) or a volatile nickel carbonyl.

17. The method of claim 13, wherein a pressure of the process chamber is between about 3 mTorr and 100 mTorr.

18. The method of claim 13, wherein the process chamber comprises $BCl_3$ provided at a flow rate of 0.5 to 100 sccm.

19. The method of claim 13, where the process chamber is under conditions where a first power (Ws) is about 100 W to 3000 W and a bias power (Wb) is between about 30 W to about 500 W.

20. A semiconductor film stack, comprising:
    a nickel silicide layer disposed upon a substrate within a plurality of layers, wherein the nickel silicide layer has an angled edge comprising a side profile that contacts the substrate on an angle in the amount of 80 degrees to 90 degrees to a substrate plane of the substrate, and wherein the nickel silicide layer is suitable as a metal line within a film stack.

* * * * *